US009372236B2

(12) United States Patent
Lee et al.

(10) Patent No.: US 9,372,236 B2
(45) Date of Patent: Jun. 21, 2016

(54) FAILURE DETERMINATION METHOD FOR MOTOR SYSTEM (71) Applicant: Hyundai Motor Company, Seoul (KR)

(72) Inventors: Dong Hun Lee, Gyeonggi-Do (KR); Soon Woo Kwon, Gyeonggi-Do (KR); Joon Yong Lee, Seoul (KR); Chang Seok Ryu, Gyeonggi-Do (KR)

(73) Assignee: Hyundai Motor Company, Seoul (KR)

( * ) Notice: Subject to any disclaimer, the term of this patent is extended or adjusted under 35 U.S.C. 154(b) by 42 days.

(21) Appl. No.: 14/550,944

(22) Filed: Nov. 22, 2014

(65) Prior Publication Data
US 2015/0362556 A1 Dec. 17, 2015

(30) Foreign Application Priority Data

Jun. 13, 2014 (KR) .......................... 10-2014-0072327

(51) Int. Cl.
*G01R 31/00* (2006.01)
*G01R 31/34* (2006.01)

(52) U.S. Cl.
CPC .................................... *G01R 31/343* (2013.01)

(58) Field of Classification Search
CPC ... G01R 31/34; G01R 31/343; G01R 31/3275
USPC .................. 318/490, 400.21, 400.22, 400.38, 318/400.39, 400.4; 361/1, 7, 23; 324/765.01
See application file for complete search history.

(56) References Cited

U.S. PATENT DOCUMENTS

| 4,532,461 | A | * | 7/1985 | Crook | .................... H02P 6/12 318/400.12 |
| 5,744,921 | A | * | 4/1998 | Makaran | .................... H02P 1/22 318/400.21 |
| 7,462,999 | B2 | * | 12/2008 | Mitchell | ............. G01R 31/343 318/400.01 |
| 7,791,293 | B2 | * | 9/2010 | Nagase | ................ B62D 5/0487 318/400.01 |
| 7,882,394 | B2 | * | 2/2011 | Hosek | ................ G05B 23/0235 702/184 |
| 8,248,039 | B2 | * | 8/2012 | Cao | ....................... F03D 7/0272 290/44 |
| 8,253,365 | B2 | * | 8/2012 | Yeh | ....................... G01R 31/343 318/400.15 |
| 8,362,726 | B2 | * | 1/2013 | Kawamura | ................ H02P 6/16 318/400.01 |

(Continued)

FOREIGN PATENT DOCUMENTS

| JP | 2002-247858 A | 8/2002 |
| JP | 2003-199386 A | 7/2003 |

(Continued)

*Primary Examiner* — Rita Leykin
(74) *Attorney, Agent, or Firm* — Mintz Levin Cohn Ferris Glovsky and Popeo, P.C.; Peter F. Corless (57) ABSTRACT A failure determination method for a motor system includes setting a current value required to initially drive a motor to a first current command value, increasing a rotational speed of a rotating magnetic field of the motor up to a preset reference speed, comparing an intensity of a back electromotive force, generated when a rotor of the motor is rotated at the preset reference speed, to a magnitude of a voltage applied to apply current in accordance with the set first current command value, and determining a cause of a failure of the motor based on the comparison.

23 Claims, 5 Drawing Sheets

(56) References Cited

U.S. PATENT DOCUMENTS

| | | | | |
|---|---|---|---|---|
| 8,471,506 B2* | 6/2013 | Manabe | ............... | G01P 3/48 318/400.02 |
| 8,471,507 B2* | 6/2013 | Akaishi | ............... | H02P 29/028 318/400.04 |
| 8,494,711 B2* | 7/2013 | Tiwari | ............... | B60W 50/0225 123/179.1 |
| 8,497,698 B2* | 7/2013 | Yeh | ............... | B60L 3/0061 318/490 |
| 8,564,232 B2* | 10/2013 | Sato | ............... | H02P 6/12 318/400.4 |
| 8,692,503 B2* | 4/2014 | Wiggers | ............... | G05B 19/401 318/560 |
| 8,810,177 B2* | 8/2014 | Schulz | ............... | H02M 7/53875 318/400.1 |
| 9,046,577 B2* | 6/2015 | Agapiou | ............... | G01R 31/34 |
| 2003/0193310 A1* | 10/2003 | Raftari | ............... | B60K 6/365 318/798 |

FOREIGN PATENT DOCUMENTS

| | | |
|---|---|---|
| KR | 10-2003-0042857 A | 6/2003 |
| KR | 10-2007-0045024 | 5/2007 |
| KR | 10-1077593 | 10/2011 |

\* cited by examiner

FAILURE DETERMINATION METHOD FOR MOTOR SYSTEM

CROSS REFERENCE TO RELATED APPLICATION

The present application claims priority to Korean Patent Application No. 10-2014-0072327, filed Jun. 13, 2014, the entire contents of which are incorporated herein for all purposes by reference.

BACKGROUND

1. Technical Field

The present disclosure relates, in general, to a failure determination method for a motor system and, more particularly, to a failure determination method for a motor system, which can classify the number of cases where a variation in the value of a position sensor of a motor is not present, and then determine whether a failure has occurred in the motor system due to the physical constraint of the rotor of the motor.

2. Description of the Related Art

In a motor system for controlling a motor based on the position of the rotor of the motor using the position sensor (e.g., a hall sensor or encoder), when the rotor is physically constrained, the rotor cannot be rotated, and thus a signal value sensed by the position sensor is not varied. Meanwhile, even if the position sensor fails or a fault occurs in a wire, a sensing circuit, or the like, a signal value output from the position sensor is similarly not varied. However, if there is no variation in the signal value sensed by the position sensor, it is determined that the position sensor has failed regardless of the cause of the failure. Therefore, there is a problem in that the cause of failure of the motor system cannot be exactly detected.

SUMMARY

Accordingly, the present disclosure has been made keeping in mind the above problems occurring in the related art, and an object of the present disclosure is to provide a failure determination method for a motor system, which can determine a failure by definitively distinguishing a case where the rotor is constrained from a case where a failure has occurred in the position sensor when there is no variation in a signal value sensed by the position sensor, even if current is applied to the stator coil so as to drive the motor.

In order to accomplish the above object, a failure determination method for a motor system according to embodiments of the present disclosure may include: setting a current value required to initially drive a motor to a first current command value; increasing a rotational speed of a rotating magnetic field of the motor up to a preset reference speed; comparing an intensity of a back electromotive force, generated when a rotor of the motor is rotated at the preset reference speed, to a magnitude of a voltage applied to apply current in accordance with the set first current command value; and determining a cause of a failure of the motor based on the comparison.

The failure determination method may further include determining whether an error between the first current command value and a sensed value of current flowing through the motor is less than a preset error, the error representing a difference between the first current command value and the sensed value of current flowing through the motor.

Comparing the intensity of the back electromotive force with the magnitude of the applied voltage may be performed when it is determined that the error is less than the preset error.

The failure determination method may further include, when it is determined that the error is equal to or greater than the preset error, determining that a switching element of an inverter for supplying a 3-phase current to the motor has failed.

Determining the cause of the failure of the motor may include determining that a position sensor of the motor has failed, when, based on the comparison, the intensity of the back electromotive force is less than the magnitude of the applied voltage.

The failure determination method may further include determining whether, based on the comparison, the intensity of the back electromotive force is greater than the magnitude of the applied voltage a preset time.

Determining the cause of the failure of the motor may include determining the cause of the failure to be constraint of the rotor of the motor, when the state in which the intensity of the back electromotive force is greater than the magnitude of the applied voltage for the preset time.

The failure determination method may further include, when, based on the comparison, the intensity of the back electromotive force is greater than the magnitude of the applied voltage, initializing the set current command value to zero.

The failure determination method may further include, after the initialization, repeating for a preset number of times: i) increasing the rotational speed of the rotating magnetic field to the preset reference speed, ii) comparing the intensity of the back electromotive force to the magnitude of the applied voltage, and iii) initializing the set current command value based on the comparison.

When a number of the repetitions exceeds the preset number of times, the cause of the failure may be determined to be constraint of the rotor of the motor.

Determining the cause of the failure of the motor may include determining the cause of the failure to be constraint of the rotor of the motor, when, based on the comparison, the intensity of the back electromotive force is greater than the magnitude of the applied voltage.

The failure determination method may further include, when a second current command value of the motor, which is determined based on a speed command value, is greater than a minimum current value required to rotate the motor, and when a phase voltage value applied to the motor is greater than a minimum phase voltage value required to rotate the motor, determining whether a value sensed by a position sensor of the motor is varied.

When the value sensed by the position sensor of the motor is not varied, the current value required to initially drive the motor may be set to the first current command value, and the rotational speed of the rotating magnetic field of the motor is increased to the preset reference speed.

Further, a failure determination method for a motor system according to embodiments of the present disclosure includes: increasing a phase voltage applied to a motor to a phase voltage required to initially drive the motor; increasing a rotational speed of a rotating magnetic field of the motor to a preset reference speed; measuring a magnitude of current generated by the applied phase voltage; comparing the magnitude of the generated current to a magnitude of a preset reference current; and determining a cause of a failure of the motor based on the comparison.

Determining the cause of the failure may include determining that a position sensor of the motor has failed, when, based on the comparison, an error between the magnitude of the preset reference current and the magnitude of the current generated by the applied phase voltage is equal to or greater than a preset error, the error representing a difference between the first current command value and the sensed value of current flowing through the motor.

Determining the cause of the failure may include determining the cause of the failure to be constraint of a rotor of the motor, when, based on the comparison, the error between the magnitude of the preset reference current and the magnitude of the current generated by the applied phase voltage is less than the preset error.

The failure determination method may further include, when, based on the comparison, the error between the magnitude of the current flowing through the motor and the magnitude of the current generated by the applied phase voltage is less than the preset error, initializing the phase voltage applied to the motor.

The failure determination method may further include, when a time for which the error is less than the preset error exceeds a preset time, repeating: i) increasing the rotational speed of the rotating magnetic field of the motor to the preset reference speed, ii) comparing the magnitude of the generated current to the magnitude of the preset reference current, and iii) initializing the phase voltage.

When a number of the repetitions is greater than the preset number of times, the cause of the failure may be determined to be constraint of a rotor of the motor.

The failure determination method may further include, when a sensed value of current flowing through the motor is greater than a minimum current value required to rotate the motor, determining an error between a current command value of the motor based on a speed command value and the sensed value of the current, the error representing a difference between the current command value of the motor and the sensed value of the current.

The failure determination method may further include, when the error between the current command value of the motor and the sensed value of the current is less than a preset error, determining whether a value sensed by a position sensor of the motor is varied.

When the value sensed by the position sensor of the motor is not varied, the phase voltage applied to the motor may be increased to the phase voltage required to initially drive the motor, and the rotational speed of the rotating magnetic field of the motor may be increased to the preset reference speed.

When the error between the current command value of the motor and the sensed value of the current is greater than the preset error, it may be determined that a switching element of an inverter for supplying a 3-phase current to the motor has failed.

BRIEF DESCRIPTION OF THE DRAWINGS

The above and other objects, features and advantages of the present disclosure will be more clearly understood from the following detailed description taken in conjunction with the accompanying drawings, in which.

DETAILED DESCRIPTION OF THE EMBODIMENTS

Specific structural or functional descriptions disclosed in the present specification or application are merely illustrated to describe embodiments of the present disclosure, and the embodiments of the present disclosure may be implemented in various forms and should not be interpreted as being limited to the embodiments herein. Rather, the embodiments according to the present disclosure may be modified in various manners and may have various forms. Specific embodiments are illustrated in the drawings and described in detail in the present specification or application. However, it should be understood that those embodiments are not intended to limit the embodiments of the present disclosure, and they include all changes, equivalents or modifications included in the spirit and scope of the present disclosure.

The terms such as "first" and "second" may be used to describe various components, but those components should not be limited by the terms. The terms are merely used to distinguish one component from other components, and a first component may be designated as a second component and a second component may be designated as a first component in the similar manner, without departing from the scope based on the concept of the present disclosure.

Throughout the entire specification, it should be understood that a representation indicating that a first component is "connected" or "coupled" to a second component may include the case where the first component is connected or coupled to the second component with some other component interposed therebetween, as well as the case where the first component is "directly connected" or "directly coupled" to the second component. In contrast, it should be understood that a representation indicating that a first component is "directly connected" or "directly coupled" to a second component means that no component is interposed between the first and second components.

Other representations describing relationships among components, that is, "between" and "directly between" or "adjacent to," and "directly adjacent to," should be interpreted in similar manners. A singular expression includes a plural expression unless a description to the contrary is specifically pointed out in context. In the present specification, it should be understood that the terms such as "include" or "have" are merely intended to indicate that features, numbers, steps, operations, components, parts, or combinations thereof are present, and are not intended to exclude a possibility that one or more other features, numbers, steps, operations, components, parts, or combinations thereof will be present or added.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Additionally, it is understood that the below methods may be executed by at least one controller. The term "controller"

may refer to a hardware device that includes a memory and a processor. The memory is configured to store program instructions, and the processor is configured to execute the program instructions to perform one or more processes which are described further below. Moreover, it is understood that the below methods may be executed by an apparatus comprising the controller, whereby the apparatus is known in the art to be suitable for performing a failure determination method for a motor system, as described herein.

Furthermore, the controller of the present disclosure may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Unless differently defined, all terms used here including technical or scientific terms have the same meanings as the terms generally understood by those skilled in the art to which the present disclosure pertains. The terms identical to those defined in generally used dictionaries should be interpreted as having meanings identical to contextual meanings of the related art, and are not interpreted as being ideal or excessively formal meanings unless they are definitely defined in the present specification.

Hereinafter, embodiments of the present disclosure will be described in detail with reference to the attached drawings. The same reference numerals are used throughout the different drawings to designate the same or similar components.

Figure 1:
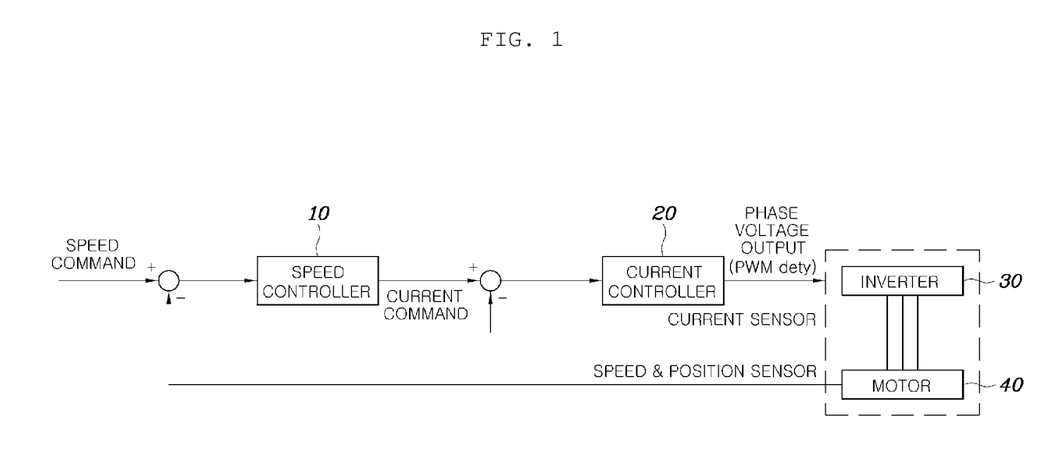
FIG. 1 is a block diagram briefly showing a motor system according to embodiments of the present disclosure.

FIG. 1 is a block diagram briefly showing a motor system according to embodiments of the present disclosure. The motor system according to the embodiments of the present disclosure includes a speed controller 10, a current controller 20, an inverter 30, and a motor 40. The speed controller 10 receives a speed command output from an upper-level controller and the rotational speed (rpm) of a motor fed back from the motor, and outputs a current command required to control the rpm of the motor. The current controller 20 receives the current command from the speed controller 10 and receives a sensed value of 3-phase current flowing from the inverter 30 to the motor 40, which is fed back, and outputs a phase voltage to the inverter 30. The inverter 30 includes a plurality of switching elements and supplies a 3-phase current to the motor 40. The motor 40 is rotated using the current supplied from the inverter 30 to generate torque and a driving force.

The speed controller 10 may be a Proportional-Integral (PI) controller, an Integral-Proportional (IP) controller, or a PI or IP hybrid controller depending on the characteristics of a system to be controlled. The current controller 20 may be a PI controller. The current controller 20 sets a phase voltage output value required to control the output current of the inverter 30 in compliance with a command value. Such controllers 10 and 20 may constitute a motor controller (not shown).

Figure 2:
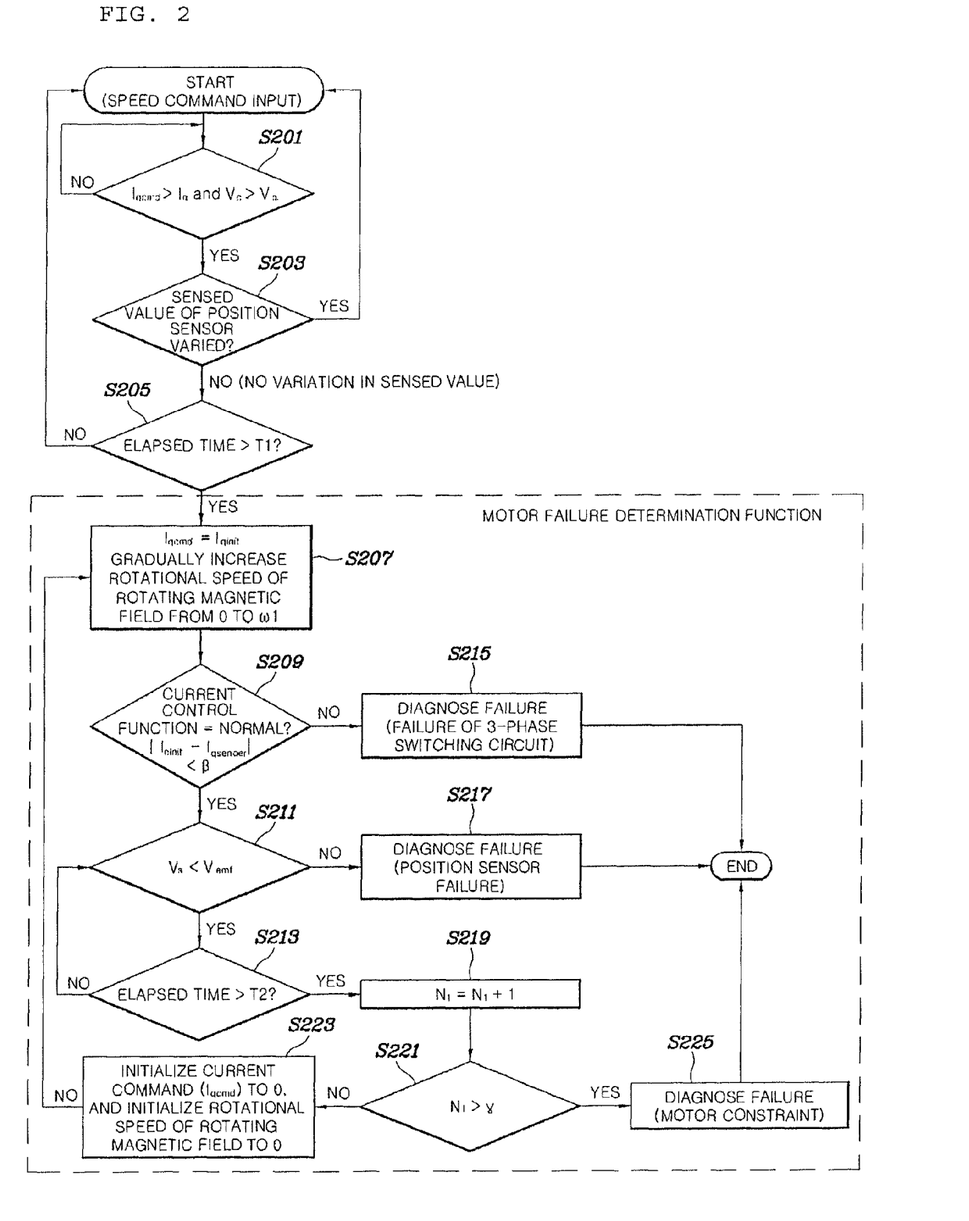
FIG. 2 is a flowchart showing a failure determination method for a motor system according to embodiments of the present disclosure.

FIG. 2 is a flowchart showing a failure determination method for a motor system according to embodiments of the present disclosure. The flowchart shown in FIG. 2 is based on a vector control technique which is most widely used for motor control on a Surface-mounted Permanent Magnet Synchronous Motor (SPMSM), but may also be applied to other types of motors. Further, a control agent at each step of the present disclosure may be the motor controller.

Referring to FIG. 2, the failure determination method for the motor system includes the step S201 of determining whether a second current command value $I_{qcmd}$ of the motor based on a speed command value input from an upper-level controller or from an external system is greater than a minimum current value $I_a$ required to rotate the motor, and a phase voltage value $V_q$ applied to the motor is greater than a minimum phase voltage value $V_a$ required to rotate the motor. That is, when the speed command other than zero is input from the upper-level controller or a motor user, the current command value $I_{qcmd}$ required to generate torque for rotating the motor is set via the speed controller. That is, it is determined whether the current command value and the 3-phase voltage value are greater than the minimum current value $I_a$ and the minimum phase voltage value $V_a$, respectively, which are required to rotate the motor.

If it is determined that the second current command value $I_{qcmd}$ of the motor is greater than the minimum current value $I_a$ required to rotate the motor, and the phase voltage value $V_q$ applied to the motor is greater than the minimum phase voltage value $V_a$ required to rotate the motor, the failure determination method further includes the step S203 of determining whether a value sensed by the position sensor of the motor is varied. That is, there is determined in advance a case where a position value sensed by the position sensor (i.e., resolver) is not varied even though the motor must be rotated if the current command value and the 3-phase voltage value are greater than the minimum current value $I_a$ and the minimum phase voltage value $V_a$, respectively, which are required to rotate the motor.

Further, it is determined whether a time for which a state in which the sensed position value is not varied when the sensed position value must be varied is maintained exceeds a preset time T1 at step S205. If the time, for which the state in which the sensed position value is not varied when the sensed position value must be varied is maintained, exceeds the preset time T1, it can be recognized that a failure has occurred in the motor system. For reference, in vector control for the SPMSM motor, the current of a stator coil is controlled in the direction of a q-axis which is a direction perpendicular to the N-pole of the permanent magnet of the rotor so as to control the torque of the motor, and a q-axis component dominantly appears in the phase voltage applied to the motor in a low-speed and low-current operation area. Thus, an example in which determination is performed based on the current and the phase voltage in the q-axis direction is shown in the drawing. Whether the torque required to rotate the motor has been applied from the inverter to the motor may be determined by checking only the applied phase voltage or checking the sensed 3-phase current. The phase voltage can be detected by sensing voltages of respective U, V and W phases, or checking the phase voltage output value of the current controller.

If the value sensed by the position sensor of the motor is not varied, the current value $I_{qinit}$ required to initially drive the motor is set to the first current command value $I_{qcmd}$, and then the rotational speed of the rotating magnetic field of the motor is increased up to a preset reference speed at step S207.

That is, in order to determine the exact cause of a motor failure, a rotating magnetic field is formed by setting the preset current value $I_{qinit}$ which is sufficient to initially drive the rotor and which is experimentally obtained or mathematically calculated in consideration of a load magnitude, to the first current command value $I_{qcmd}$ and by applying the first current command value to the 3-phase coil of the stator. Then, the angular velocity of the rotating magnetic field is gradually increased from zero to w1 which is an angular velocity sufficient to check the intensity of the back electromotive force.

The reason for applying the preset current value $I_{qinit}$ sufficient to initially drive the rotor and gradually increasing the angular velocity of the rotating magnetic field is that, if the angular velocity of the rotating magnetic field is rapidly increased or if the value of $I_{qinit}$ is set to a large value, the rotor of the motor cannot be rotated in synchronization with the rotating magnetic field. That is, the values $I_{qinit}$ and w1 must be preset so that the rotor can be rotated in synchronization with the rotating magnetic field.

Thereafter, in order to determine whether a current control function is in a normal state, it is determined whether an error (i.e., a difference) between the first current command value $I_{qinit}$ and a sensed value of current $I_{qsensor}$ flowing through the motor is less than a preset error β at step S209.

If the error between the first current command value $I_{qinit}$ and the sensed value of the current $I_{qsensor}$ flowing through the motor is less than the preset error β, the intensity of the back electromotive force $V_{emf}$ generated when the rotor is rotating at the increased rotational speed (rpm), is compared with the sum of vectors (i.e., vector sum) $V_s$ of the 3-phase voltage applied to the motor so as to apply the current as the set first current command value $I_{qinit}$ at step S211. If the intensity of the back electromotive force $V_{emf}$ generated when the rotor is rotating at the increased rotational speed, is less than or equal to the vector sum $V_s$ of the 3-phase voltage applied to the motor so as to apply the current as the set first current command value $I_{qinit}$, it is determined that the cause of the failure of the motor system is the failure of the position sensor of the motor at step S217, and the algorithm is terminated. If the intensity of the back electromotive force $V_{emf}$ generated when the rotor is rotating at the increased rotational speed, is greater than the vector sum $V_s$ of the 3-phase voltage applied to the motor so as to apply the current as the set first current command value $I_{qinit}$, it is determined whether such a state is maintained for a preset time T2 at step S213. This step is performed to secure the reliability of determination.

When the state in which the intensity of the back electromotive force $V_{emf}$ is greater than the vector sum $V_s$ of the phase voltage is maintained for the preset time T2, a count value is increased at step S219. The increased count value is compared with the preset number of times γ at step S221. If the increased count value is greater than the predetermined number of times γ, it is determined that the cause of the failure of the motor is the constraint of the rotor of the motor at step S225. If the increased count value is less than or equal to the predetermined number of times γ, all of the first current command value $I_{qcmd}$, the rotating magnetic field, and the rotational speed are initialized to '0' at step S223, and a cycle defined by steps S207, S209, S211, S213, S219, and S221 is repeated. Once a one-cycle procedure is completed, the count value is increased. If the count value exceeds the predetermined number of times, that is, if results indicating that the state in which the intensity of the back electromotive force $V_{emf}$ is greater than the vector sum $V_s$ of the phase voltage is maintained for the preset time T2 are repeatedly obtained a predetermined number of times, it may be determined that the cause of the failure of the motor is the constraint of the rotor. If the cause of the failure has been determined, the algorithm is terminated.

In contrast, when the error between the first current command value $I_{qinit}$ and the sensed value of the current $I_{qsensor}$ flowing through the motor is equal to or greater than the preset error β, it is determined that the cause of the failure of the motor system is the failure of a 3-phase switching circuit in the inverter at step S215, and the algorithm is terminated.

That is, when the error between the current command value and the sensed current value is checked and is equal to or greater than the preset error β, it may be determined that the phase voltage is not normally controlled due to the failure of the 3-phase output circuit (e.g., 3-phase switching element, 3-phase Pulse Width Modulation (PWM) output circuit, or the like) of the inverter, and then the motor has failed. When the error between the current command value and the sensed current value is checked and is less than the preset error β, the applied phase voltage $V_s$ is compared with the intensity of the back electromotive force $V_{emf}$ at the angular velocity w1. If $V_s$ is less than $V_{emf}$, it may be determined that the rotor is physically constrained and cannot be rotated, and thus the back electromotive force cannot be generated. In contrast, if $V_s$ is equal to or greater than $V_{emf}$, it may be determined that failure has occurred in the motor system due to the failure of the position sensor of the motor because the rotor is normally rotated to generate the back electromotive force.

Figure 3:
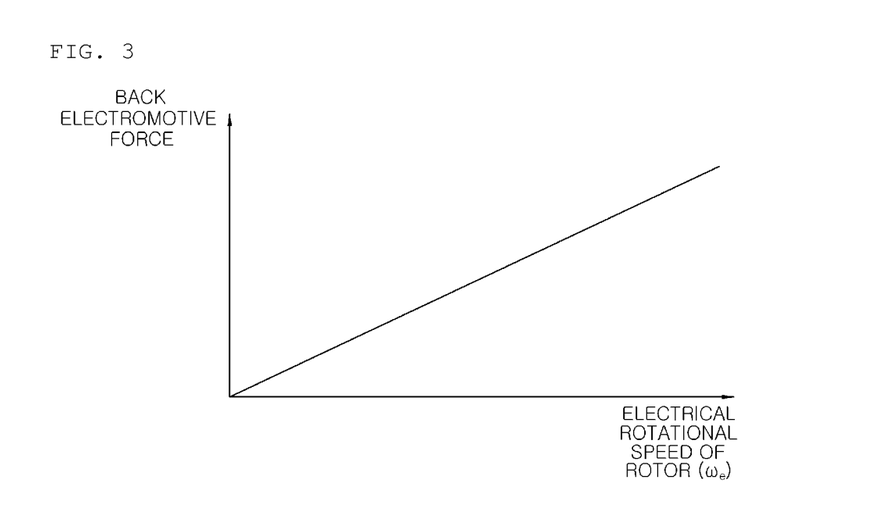
FIG. 3 is a graph showing a relationship between the electrical rotational speed of the rotor of a motor and a generated back electromotive force.

FIG. 3 is a graph showing a relationship between the electrical rotational speed (rpm) of the rotor of the motor and the generated back electromotive force. Referring to FIG. 3, it can be seen that the electrical rotational speed $w_e$ of the rotor is proportional to the intensity of the back electromotive force. This relationship is represented by the following Equation (1):

$$V_{emf} = \lambda_f w_e \quad (1)$$

where $V_{emf}$ denotes the back electromotive force, $\lambda_f$ denotes the magnetic flux of a field magnet, and $w_e$ denotes electrical rotational speed. $\lambda_f$ is a constant value typically determined by a permanent magnet. That is, according to the above equation, if the rpm w1 of the motor is known, the back electromotive force $V_{emf}$ at that time can be known.

Figure 4A:
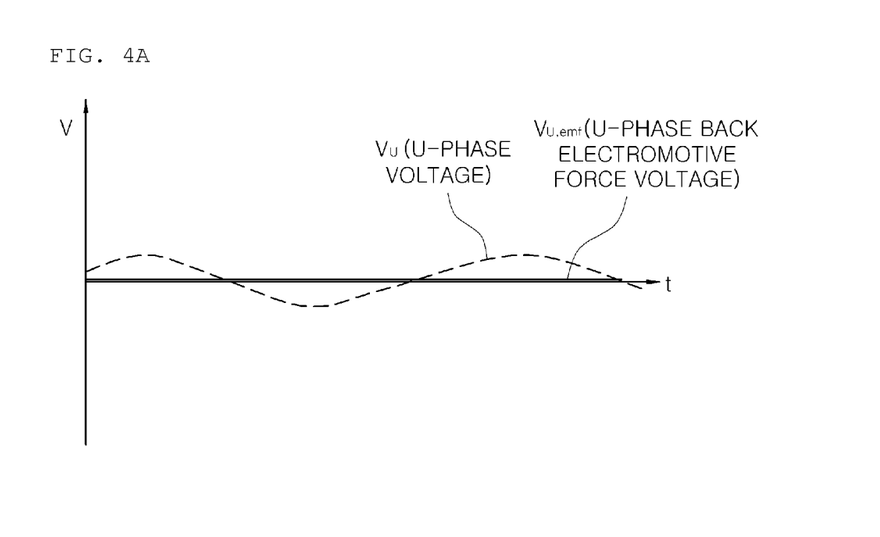
FIGS. 4A and 4B are graphs showing variations in phase voltage and back electromotive force voltage when the rotor of the motor is constrained and when the rotor of the motor is not constrained, respectively.
Figure 4B:
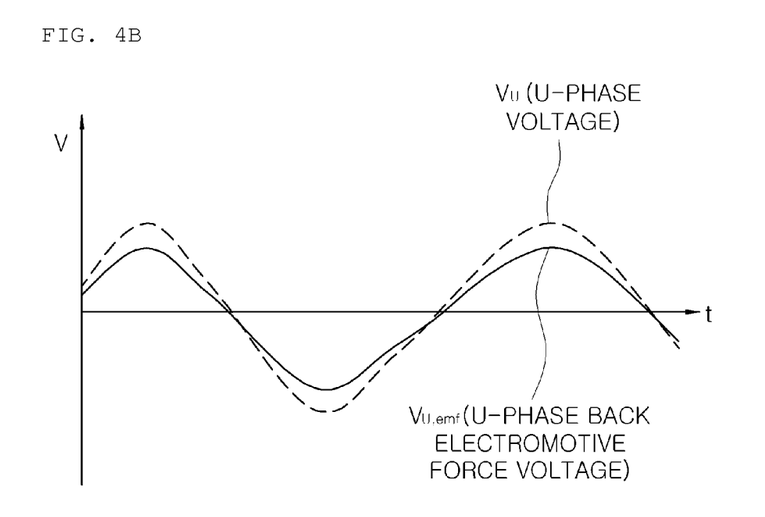

FIGS. 4A and 4B are graphs showing variations in phase voltage and back electromotive force voltage when the rotor of the motor is constrained and when the rotor of the motor is not constrained, respectively.

As shown in FIG. 4A, when the rotor is constrained, the voltage of the back electromotive force, generated due to variation while the magnetic flux of the rotor passes through the winding of the stator, is zero. Therefore, in order to apply current in compliance with the current command value $I_{qcmd}$, a relatively low phase voltage only needs to be applied. However, as shown in FIG. 4B, when the rotor is not constrained, the back electromotive force is generated while the rotor is rotating at the electrical rotational speed of w1. Therefore, in order to apply the current in compliance with the current command value $I_{qcmd}$, a phase voltage equal to or greater than the generated back electromotive force must be applied, and thus $V_{emf}$ is greater than $V_s$ in FIG. 2.

Even if the rotor is not constrained, a case may occur where the rotor cannot keep up with the rotation of the rotating magnetic field, is not synchronized with the rotating magnetic field, and becomes out of phase, resulting in a back electromotive force not being generated. Therefore, in order to prevent false diagnosis, there is a need to repeat the determination even if $V_s$ is less than $V_{emf}$. That is, a cycle defined by steps S207, S209, S211, S213, S219, and S221 of FIG. 2 may be repeated. If the cycle is repeated, the current command value, the rotating magnetic field, and the rotational speed (rpm) must be initialized to '0' so as to minimize the out-of-phase state of the rotor.

Figure 5:
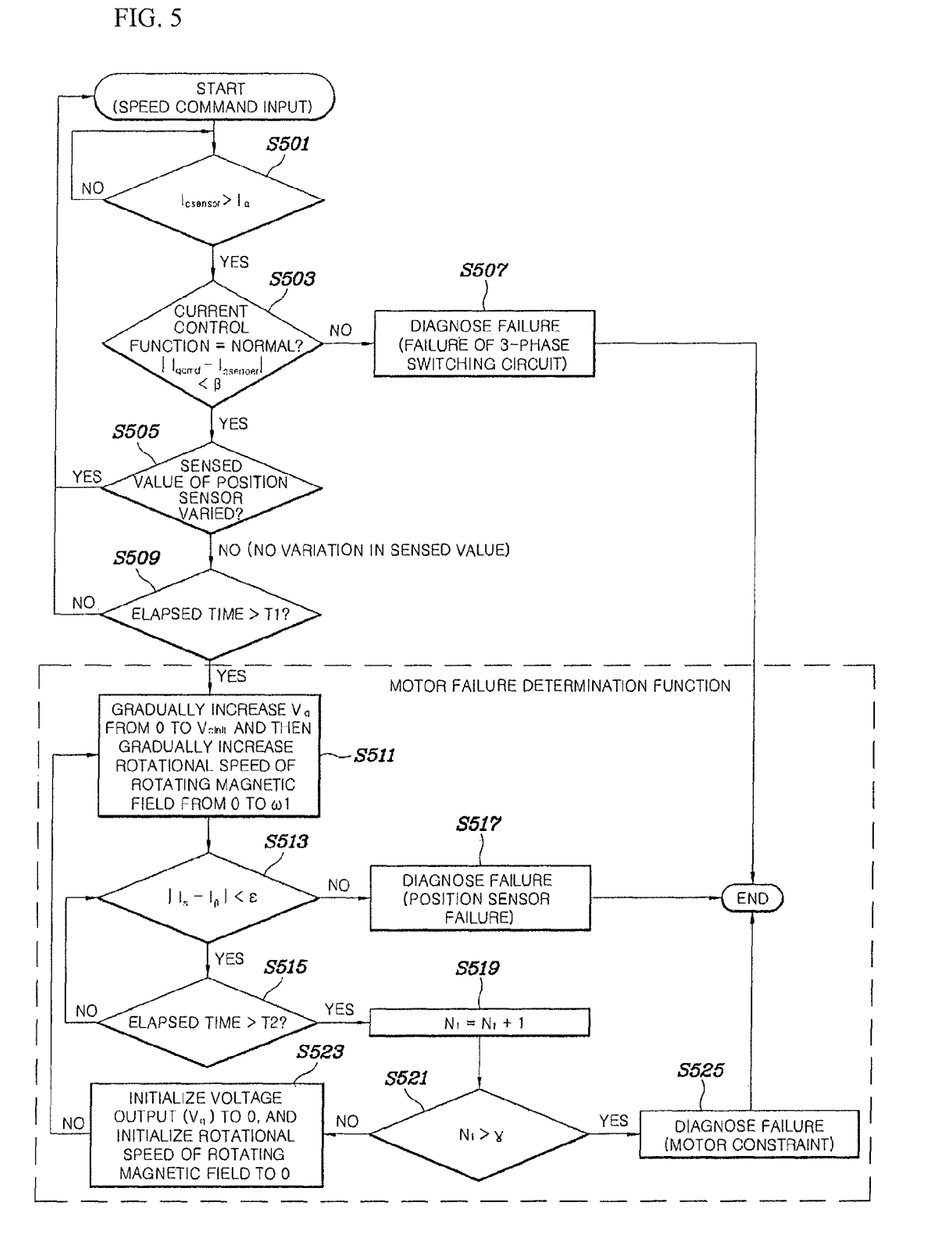
FIG. 5 is a flowchart showing a failure determination method for a motor system according to embodiments of the present disclosure.

FIG. 5 is a flowchart showing a failure determination method for a motor system according to embodiments of the present disclosure.

A failure determination method for a motor system according to embodiments of the present disclosure may include the step S501 of determining whether a sensed value of current $I_{qsensor}$ flowing through a motor is greater than a minimum current value $I_a$ required to rotate the motor, and the step S503 of, if the sensed value of the current $I_{qsensor}$ flowing through the motor is greater than the minimum current value $I_s$ required to rotate the motor, comparing an error between the current command value $I_{qcmd}$ of the motor based on a speed command value and the sensed current value $I_{qsensor}$.

If the error between the current command value $I_{qcmd}$ of the motor and the sensed current value $I_{qsensor}$ is less than a preset error β, it is determined whether a value sensed by the position sensor of the motor is varied at step S505. It is determined whether a state in which the value sensed by the position sensor of the motor is not varied is maintained for a preset time T1 at step S509. If the state in which the value sensed by the position sensor of the motor is not varied is maintained for the preset time T1, the rotating magnetic field of the motor is gradually increased from zero to w1 by increasing a phase voltage $V_q$ applied to the motor to a phase voltage $V_{qinit}$ required to initially drive the motor at step S511. In contrast, if the error between the current command value $I_{qcmd}$ of the motor and the sensed current value $I_{qsensor}$ is equal to or greater than the preset error β, it may be determined that the cause of the failure of the motor system is the failure of the switching element of an inverter that supplies a 3-phase current to the motor at step S507.

Thereafter, the magnitude of the vector sum of the 3-phase current flowing through the motor, that is, the magnitude of the current $I_s$ generated by the applied phase voltage, is compared with the magnitude of current $I_β$ flowing when the phase voltage $V_{qinit}$ is applied in a state in which the motor is stopped at step S513. When an error between the magnitude of the vector sum $I_s$ of the 3-phase current and the magnitude of the current $I_β$ generated by the applied phase voltage $V_{qinit}$ is equal to or greater than a preset error ε, it may be determined that the cause of the failure in the motor system is the failure of the position sensor of the motor at step S517. If the determination has been completed, the failure determination algorithm is terminated.

When the error between the magnitude of the vector sum $I_s$ of the 3-phase current and the magnitude of the current $I_β$ generated by the applied phase voltage $V_{qinit}$ in the stopped state of the motor is less than the preset error ε, it is determined whether a state in which the error between the magnitude of the vector sum $I_s$ of the 3-phase current and the magnitude of the current $I_β$ generated by the applied phase voltage $V_{qinit}$ is less than the preset error ε is maintained for a preset time T2 at step S515. This step is performed to secure the reliability of determination.

If the state in which the error between the magnitude of the vector sum $I_s$ of the 3-phase current and the magnitude of the current $I_β$ generated by the applied phase voltage $V_{qinit}$ in the stopped state of the motor is less than the preset error ε is maintained for the preset time T2, a count value is increased at step S519. The increased count value is compared with the predetermined number of times γ at step S521. If the increased count value is greater than the predetermined number of times γ, it is determined that the cause of the failure of the motor is the constraint of the rotor of the motor at step S525. If the increased count value is less than or equal to the predetermined number of times γ, all of the phase voltage $V_q$ applied to the motor, the rotating magnetic field, and the rotational speed are initialized to '0' at step S523. Then, a cycle defined by steps S511, S513, S515, S517, and S519 is repeated. If a one-cycle procedure has been completed, a count value is increased. If the count value exceeds the predetermined number of times, that is, if results indicating that the state in which the error between the magnitude of the vector sum $I_s$ of the 3-phase current and the magnitude of the current $I_β$ generated by the applied phase voltage $V_{qinit}$ in the stopped state of the motor is less than the preset error ε is maintained for the preset time T2 are repeatedly obtained a predetermined number of times, it may be determined that the cause of the failure of the motor is the constraint of the rotor at step S525. If the cause of the failure has been determined, the algorithm is terminated. In other words, it may be determined whether the constraint of the rotor has occurred and whether the position sensor has failed depending on the difference between the magnitude of the current $I_s$ flowing through the motor and the magnitude of the preset reference current $I_β$.

The step of determining that the cause of the failure of the motor system is in the 3-phase switching circuit is different from that of the method in FIG. 2. According to the method shown in FIG. 5, since the magnitude of current $I_{qcmd}$ of FIG. 5 is greater than the magnitude of current $I_{qinit}$ of FIG. 2, the influence of current sensing noise is reduced, and thus the error between the current command value and the sensed current value may be more easily checked.

Unlike the method shown in FIG. 2, the method of FIG. 5 increases the applied phase voltage, and thus the cause of the failure of the motor system may be determined by means of current values, as demonstrated below with respect to Equation (2).

$$V_q = R_s I_q + L_q \frac{dI_q}{dt} + L_d I_d w_e + V_{emf} \quad (2)$$

In Equation (2), $V_q$ denotes a phase voltage applied to the q-axis of a synchronous coordinate system, and $R_s$ denotes the winding resistance of the motor. d denotes the d-axis of the synchronous coordinate system and q denotes the q-axis of the synchronous coordinate system. That is, $L_q$ denotes a q-axis inductance, $L_d$ denotes a d-axis inductance, $I_q$ denotes a q-axis current, and $I_d$ denotes a d-axis current. $w_e$ denotes an electrical rotational speed.

If the rotor of the motor is constrained, the electrical rotational speed $w_e$ is zero and is in normal state, as summarized in the q-axis voltage-current relational expression (Equation (2)) of the synchronous coordinate system. Accordingly, a q-axis current variation over time is zero and the back electromotive force $V_{emf}$ is also zero, and thus the q-axis current may be represented by $V_q/R_s$. Since $R_s$ is a very small value, a relatively large current of $I_β$ relative to the phase voltage $V_{qinit}$ applied in the direction of the q-axis is generated.

However, when the rotor is not constrained and is rotated in synchronization with the rotating magnetic field, a back electromotive force is generated, so that the magnitude of current $I_s$ flowing through the phase is much smaller than $I_β$, and thus it may be determined whether the rotor of the motor has been constrained via the comparison between $I_s$ and $I_β$.

In accordance with a failure determination method for a motor system according to embodiments of the present disclosure, there is an advantage in that, in a failure situation of the motor system in which a motor is not normally rotated even if an inverter performs normal speed control, the cause of the failure can be precisely determined. Therefore, there is a further advantage in that cost and time required for service and repair of the motor system can be minimized, and appropriate recovery operation modes can be applied in accordance with the causes of failures, thus improving the stability of the system.

Although the embodiments of the present disclosure have been disclosed for illustrative purposes, those skilled in the art will appreciate that various modifications, additions and substitutions are possible, without departing from the scope and spirit of the disclosure as disclosed in the accompanying claims. Therefore, the technical scope of the present disclosure should be defined by the technical spirit and scope of the accompanying claims.

What is claimed is:

1. A failure determination method for a motor system, comprising:
    setting a current value required to initially drive a motor to a first current command value;
    increasing a rotational speed of a rotating magnetic field of the motor to a preset reference speed;
    comparing an intensity of a back electromotive force, generated when a rotor of the motor is rotated at the preset reference speed, to a magnitude of a voltage applied to apply current in accordance with the set first current command value; and
    determining a cause of a failure of the motor based on the comparison.

2. The failure determination method of claim 1, further comprising determining whether an error between the first current command value and a sensed value of current flowing through the motor is less than a preset error,
    wherein the error represents a difference between the first current command value and the sensed value of current flowing through the motor.

3. The failure determination method of claim 2, wherein the comparing of the intensity of the back electromotive force to the magnitude of the applied voltage is performed when it is determined that the error is less than the preset error.

4. The failure determination method of claim 2, further comprising, when it is determined that the error is equal to or greater than the preset error, determining that a switching element of an inverter for supplying a 3-phase current to the motor has failed.

5. The failure determination method of claim 1, wherein the determining of the cause of the failure of the motor comprises determining that a position sensor of the motor has failed, when, based on the comparison, the intensity of the back electromotive force is less than the magnitude of the applied voltage.

6. The failure determination method of claim 1, further comprising determining whether, based on the comparison, the intensity of the back electromotive force is greater than the magnitude of the applied voltage for a preset time.

7. The failure determination method of claim 6, wherein the determining of the cause of the failure of the motor comprises determining the cause of the failure to be constraint of the rotor of the motor, when the intensity of the back electromotive force is greater than the magnitude of the applied voltage for the preset time.

8. The failure determination method of claim 1, further comprising, when, based on the comparison, the intensity of the back electromotive force is greater than the magnitude of the applied voltage, initializing the set current command value to zero.

9. The failure determination method of claim 8, further comprising, after the initialization, repeating for a preset number of times: i) increasing the rotational speed of the rotating magnetic field to the preset reference speed, ii) comparing the intensity of the back electromotive force to the magnitude of the applied voltage, and iii) initializing the set current command value based on the comparison.

10. The failure determination method of claim 9, wherein, when a number of the repetitions exceeds the preset number of times, the cause of the failure is determined to be constraint of the rotor of the motor.

11. The failure determination method of claim 1, wherein the determining of the cause of the failure of the motor comprises determining the cause of the failure to be constraint of the rotor of the motor, when, based on the comparison, the intensity of the back electromotive force is greater than the magnitude of the applied voltage.

12. The failure determination method of claim 1, further comprising, when a second current command value of the motor, which is determined based on a speed command value, is greater than a minimum current value required to rotate the motor, and when a phase voltage value applied to the motor is greater than a minimum phase voltage value required to rotate the motor, determining whether a value sensed by a position sensor of the motor is varied.

13. The failure determination method of claim 12, wherein, when the value sensed by the position sensor of the motor is not varied, the current value required to initially drive the motor is set to the first current command value, and the rotational speed of the rotating magnetic field of the motor is increased to the preset reference speed.

14. A failure determination method for a motor system, comprising:
    increasing a phase voltage applied to a motor to a phase voltage required to initially drive the motor;
    increasing a rotational speed of a rotating magnetic field of the motor to a preset reference speed;
    measuring a magnitude of current generated by the applied phase voltage;
    comparing the magnitude of the generated current to a magnitude of a preset reference current; and
    determining a cause of a failure of the motor based on the comparison.

15. The failure determination method of claim 14, wherein the determining of the cause of the failure comprises determining that a position sensor of the motor has failed, when, based on the comparison, an error between the magnitude of the preset reference current and the magnitude of the current generated by the applied phase voltage is equal to or greater than a preset error,
    wherein the error represents a difference between the first current command value and the sensed value of current flowing through the motor.

16. The failure determination method of claim 15, wherein the determining of the cause of the failure comprises determining the cause of the failure to be constraint of a rotor of the motor, when, based on the comparison, the error between the magnitude of the preset reference current and the magnitude of the current generated by the applied phase voltage is less than the preset error.

17. The failure determination method of claim 15, further comprising, when, based on the comparison, the error between the magnitude of the preset reference current and the magnitude of the current generated by the applied phase voltage is less than the preset error, initializing the phase voltage applied to the motor.

18. The failure determination method of claim 17, further comprising, when a time for which the error is less than the preset error exceeds a preset time, repeating: i) increasing the rotational speed of the rotating magnetic field of the motor to the preset reference speed, ii) comparing the magnitude of the generated current to the magnitude of the preset reference current, and iii) initializing the phase voltage.

19. The failure determination method of claim 18, wherein, when a number of the repetitions is greater than a preset number of times, the cause of the failure is determined to be constraint of a rotor of the motor.

20. The failure determination method of claim 14, further comprising, when a sensed value of current flowing through the motor is greater than a minimum current value required to rotate the motor, determining an error between a current command value of the motor based on a speed command value and the sensed value of the current, wherein the error represents a difference between the current command value of the motor and the sensed value of the current.

21. The failure determination method of claim 20, further comprising, when the error between the current command value of the motor and the sensed value of the current is less than a preset error, determining whether a value sensed by a position sensor of the motor is varied.

22. The failure determination method of claim 21, wherein, when the value sensed by the position sensor of the motor is not varied, the phase voltage applied to the motor is increased to the phase voltage required to initially drive the motor, and the rotational speed of the rotating magnetic field of the motor is increased to the preset reference speed.

23. The failure determination method of claim 20, wherein, when the error between the current command value of the motor and the sensed value of the current is greater than the preset error, it is determined that a switching element of an inverter for supplying a 3-phase current to the motor has failed.

* * * * *